(12) United States Patent
Nakatsugawa (10) Patent No.: US 9,981,455 B2
(45) Date of Patent: May 29, 2018

(54) GAS BARRIER FILM, APPARATUS, AND PROCESS FOR PRODUCING GAS BARRIER FILM

(75) Inventor: Yuji Nakatsugawa, Matsudo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 333 days.

(21) Appl. No.: 13/512,169

(22) PCT Filed: Nov. 25, 2010

(86) PCT No.: PCT/JP2010/070990
§ 371 (c)(1),
(2), (4) Date: Jul. 17, 2012

(87) PCT Pub. No.: WO2011/065404
PCT Pub. Date: Jun. 3, 2011

(65) Prior Publication Data
US 2012/0276353 A1   Nov. 1, 2012

(30) Foreign Application Priority Data

Nov. 27, 2009  (JP) .................................. 2009-269391
Nov. 19, 2010  (JP) .................................. 2010-258551

(51) Int. Cl.
| | | |
|---|---|---|
| B32B 27/36 | (2006.01) |
| C23C 14/06 | (2006.01) |
| C23C 14/35 | (2006.01) |
| H01L 31/049 | (2014.01) |

(52) U.S. Cl.
CPC .......... *B32B 27/36* (2013.01); *C23C 14/0676* (2013.01); *C23C 14/35* (2013.01); *H01L 31/049* (2014.12); *Y02E 10/50* (2013.01); *Y10T 428/2495* (2015.01); *Y10T 428/24967* (2015.01)

(58) Field of Classification Search
CPC .................................. B32B 7/02; B32B 27/36
USPC .................................. 428/212, 213, 215, 220
See application file for complete search history.

(56) References Cited

U.S. PATENT DOCUMENTS

2008/0017241 A1 * 1/2008 Anderson .......... B32B 17/10587
                                                        136/251
2009/0095345 A1 * 4/2009 Murakami et al. ........... 136/252

FOREIGN PATENT DOCUMENTS

| JP | 09-099530 A1 | 4/1997 |
| JP | 11-288622 A1 | 10/1999 |
| JP | 2000-108285 A1 | 4/2000 |
| JP | 2008-004839 A1 | 1/2008 |
| JP | 2008-227203 A1 | 9/2008 |
| JP | 2008-246894 A1 | 10/2008 |

* cited by examiner

*Primary Examiner* — Lawrence Ferguson
(74) *Attorney, Agent, or Firm* — Burr & Brown, PLLC (57) ABSTRACT

A gas barrier film, an apparatus comprising the gas barrier film, and a process for producing the gas barrier film are provided. The gas barrier film comprises a plastic film having an oligomer content of not more than 1% by weight, an organic layer provided on the plastic film, and an inorganic layer provided on the organic layer. The organic layer has a thickness that is larger than a maximum difference in elevation on the surface of the plastic film. The gas barrier film having the above construction has excellent gas barrier properties.

7 Claims, 2 Drawing Sheets

GAS BARRIER FILM, APPARATUS, AND PROCESS FOR PRODUCING GAS BARRIER FILM

BACKGROUND OF THE INVENTION

1. Field of the Invention

The present invention relates to a gas barrier film, an apparatus using the gas barrier film, and a process for producing the gas barrier film.

2. Description of Related Art

Predetermined gas barrier properties and durability such as heat resistance, light fastness, hydrolysis resistance, and moisture resistance that are high enough to withstand severe natural environment over a long period of time are required of backside protective sheets for solar battery modules.

Patent document 1 describes a backside protective sheet for a solar battery module. The backside protective sheet comprises a gas barrier film comprising a film base material resistant to weathering and hydrolysis and a vapor-deposited layer provided on at least one surface of the film base material and formed of an inorganic compound, and a heat-resistant film base material provided on the gas barrier film.

More specifically, the patent document pays attention to a drawback of a barrier film comprising a polyethylene terephthalate (PET) film base material and a vapor-deposited film of an inorganic oxide provided on one surface of the polyethylene terephthalate (PET) base material. The claimed drawback is that polyethylene terephthalate (PET) in the barrier film causes lowered water vapor (moisture) barrier properties due to hydrolytic deterioration or the like under high-temperature and high-humidity conditions, making it difficult to maintain long-term durability of solar batteries. To solve this problem, a heat-resistant film base material is stacked on the gas barrier film.

In fact, in Example 1 of the patent document, a heat-resistant film base material (PET #50) and a heat-resistant film base material (PET #188) are stacked on the film base material (PEN #12) side of the gas barrier film and on the vapor-deposited layer (VM) side, respectively, with a two-component curable polyurethane adhesive having a solid content of 30% by weight by a dry lamination method.

PRIOR ART DOCUMENT

Patent Document

[Patent document 1] Japanese Patent Laid-Open No. 227203/2008 (claim 1, paragraph 0008, and paragraph 0085)

SUMMARY OF THE INVENTION

Problems to be Solved by the Invention

The present inventor has made studies on the backside protective sheet for a solar battery module described in patent document 1 and, as a result, has found that the backside protective sheet suffers from a drawback of unsatisfactory gas barrier properties due to the adoption of a construction that the heat-resistant film base material is applied to the gas barrier film through an adhesive.

That is, the heat-resistant film base material is excellent in heat resistance, as well as in mechanical strength, weathering resistance, and hydrolysis resistance, and, thus, an improvement in gas barrier properties of the backside protective sheet for a solar battery module can be expected through the use of the film base material. In patent document 1, however, the heat-resistant film base material is bonded to both surfaces of the gas barrier film through a two-component curable polyurethane adhesive. Accordingly, water is likely to enter through the adhesive. As a result, gas barrier properties expected by the heat-resistant film base material cannot be disadvantageously satisfactorily exerted.

In fact, as a result of studies conducted by the present inventor, it has been found that gas barrier properties on a level of $10^{-2}$ g/m$^2$·day (not more than 0.01 g/m$^2$·day) are required for practical use as a backside protective sheet for a solar battery module. As shown in Table 3 at paragraph 0104 of patent document 1, the water vapor barrier property level of the backside protective sheet for a solar battery module described in the patent document is as low as about 0.15 g/m$^2$·day and thus is unsuitable for practical use.

The present invention has been made with a view to solving the problem, and a first object of the present invention is to provide a gas barrier film having excellent gas barrier properties.

The present invention has been made with a view to solving the problem, and a second object of the present invention is to provide an apparatus using a gas barrier film having excellent gas barrier properties.

The present invention has been made with a view to solving the problem, and a third object of the present invention is to provide a process for producing a gas barrier film that can produce a gas barrier film having excellent gas barrier properties.

Means for Solving the Problem

The present inventor has made studies on the use, as the base material per se of the gas barrier film, of a heat-resistant base material having excellent hydrolysis resistance and expected to impart improved gas barrier properties rather than the application of the film base material to the gas barrier film through the adhesive by the dry lamination method as in patent document 1. More specifically, the present inventor has made studies on whether or not an inorganic material-containing inorganic layer can be formed directly on the heat-resistant film base material to form a gas barrier film.

In the process of studies, the oligomer content of the film base material was reduced for hydrolysis resistance improvement purposes (when reference is hereinafter made to "plastic film", the plastic film sometimes means a film base material, of which the oligomer content has been reduced). As a result, it has been found that the surface roughness of the plastic film is increased and the maximum level difference of the film surface is on µm order. On the other hand, the thickness of the inorganic layer of silicon oxide or the like is in a range of several tens of nanometers to several hundreds of nanometers. Accordingly, when the surface roughness of the plastic film is increased, the inorganic layer cannot completely cover the surface of the plastic film. As a result, areas not covered by the inorganic layer had no satisfactory gas barrier properties. The use of a plastic film having improved hydrolysis resistance which is expected to impart improved gas barrier properties posed a new problem of worsened gas barrier properties.

The present inventor has made extensive and intensive studies with a view to solving the above problem of the prior art and, as a result, has found that the above problem can be solved by providing an organic layer between the plastic film having improved hydrolysis resistance and the inorganic layer to cover the rough plastic film surface to flatten the surface, which has led to the completion of the present invention.

According to a first aspect of the present invention, there is provided a gas barrier film comprising: a plastic film having an oligomer content of not more than 1% by weight; an organic layer provided on the plastic film; and an inorganic layer provided on the organic layer, the organic layer having a thickness that is larger than a maximum difference in elevation on the surface of the plastic film.

According to this invention, by virtue of the construction of the gas barrier film comprising: a plastic film having an oligomer content of not more than 1% by weight; an organic layer provided on the plastic film; and an inorganic layer provided on the organic layer, the organic layer having a thickness that is larger than a maximum difference in elevation on the surface of the plastic film, an inorganic layer having a good film quality can be likely to be formed by reducing the oligomer content of the plastic film, and, even when the maximum difference in elevation on the surface of the plastic film is increased due to the reduction of the oligomer content, the organic layer covers the maximum difference in elevation to flatten the surface. The inorganic layer is provided on the flattened organic layer. Consequently, a gas barrier film having excellent gas barrier properties can be provided.

According to a second aspect of the present invention, there is provided a gas barrier film comprising: a plastic film having an oligomer content of not more than 1% by weight; an organic layer provided on the plastic film; and an inorganic layer provided on the organic layer, the organic layer having a thickness of not less than 1.7 μm and not more than 10 μm.

According to this invention, in addition to the construction and function effect of the gas barrier film according to the first aspect of the present invention, an additional effect can be attained that, since the thickness of the organic layer is not less than 1.7 μm and not more than 10 the maximum difference in elevation on the surface of the plastic film can be more reliably covered by the organic layer and the gas barrier properties of the gas barrier film can be more reliably improved.

In a preferred embodiment of the gas barrier film according to the present invention, the plastic film is formed of polyethylene terephthalate.

According to this invention, the plastic film is formed of polyethylene terephthalate. Polyethylene terephthalate is likely to be crystallized. This property is more clearly exposed by reducing the oligomer content. As a result, the roughness of the surface of the plastic film formed of polyethylene terephthalate, of which the oligomer content has been reduced, is likely to be increased, and, accordingly, the usefulness of the smoothing of the surface by the organic layer is enhanced.

According to another aspect of the present invention, there is provided a device that comprises the gas barrier film of the present invention described above and is a display device or a power generating device.

According to this invention, the device comprises the gas barrier film of the present invention described above and is a display device or a power generating device. This means that the gas barrier film of the present invention is used in a display device or a power generating device that is required to have a high gas barrier property level of not more than $10^{-2}$ g/m$^2$·day (not more than 0.01 g/m$^2$·day). Accordingly, a device comprising a gas barrier film having excellent gas barrier properties can be provided.

According to a further aspect of the present invention, there is provided a process for producing a gas barrier film, comprising: a plastic film provision step of providing a plastic film having an oligomer content of not more than 1% by weight; an organic layer formation step of forming an organic layer on the plastic film, the organic layer having a thickness that is larger than a maximum difference in elevation on the surface of the plastic film; and an inorganic layer formation step of forming an inorganic layer on the organic layer.

According to this invention, since the process for producing a gas barrier film comprises a plastic film provision step of providing a plastic film having an oligomer content of not more than 1% by weight; an organic layer formation step of forming an organic layer on the plastic film, the organic layer having a thickness that is larger than a maximum difference in elevation on the surface of the plastic film; and an inorganic layer formation step of forming an inorganic layer on the organic layer, the reduction in oligomer content of the plastic film makes it easy to form an inorganic layer having a good film quality and, by virtue of the reduced oligomer content, even when the maximum difference in elevation of the plastic film surface is increased, the organic layer covers the maximum difference in elevation to flatten the surface and an inorganic layer is provided on the flattened organic layer. As a result, a production process that can produce a gas barrier film having excellent gas barrier properties can be provided.

Effect of the Invention

The gas barrier film according to the present invention has excellent gas barrier properties.

The apparatus according to the present invention is an apparatus comprising a gas barrier film having excellent gas barrier properties.

The process for producing a gas barrier film according to the present invention is a production process that can produce a gas barrier film having excellent gas barrier properties.

DETAILED DESCRIPTION OF THE INVENTION

Embodiments of the present invention will be described in more detail. However, it should be noted that the present invention is not limited by the following embodiments and various variations and modifications can be effected within the scope of the invention.

<Gas Barrier Film>

Figure 1:
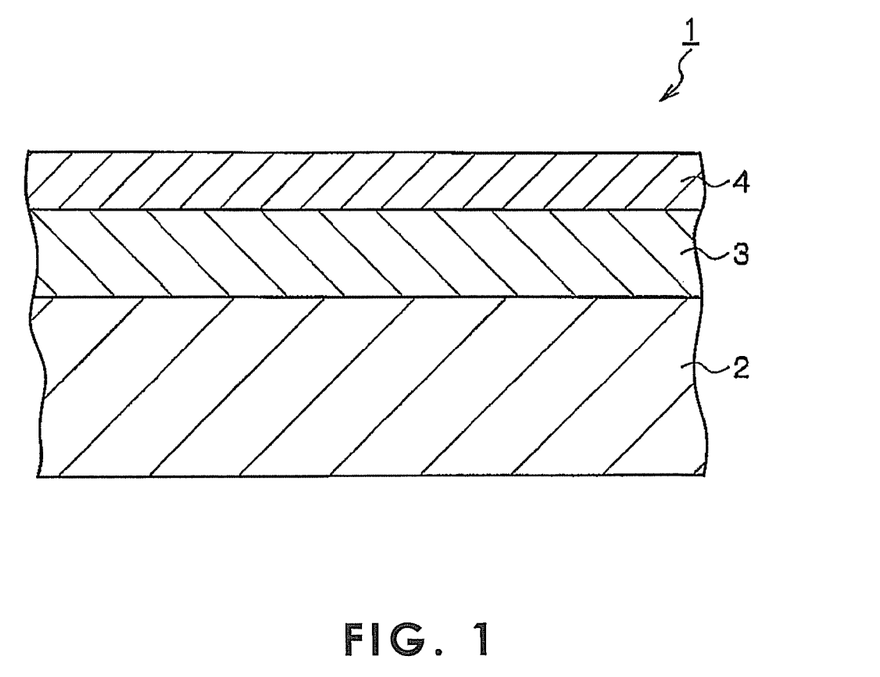
FIG. 1 is a typical cross-sectional view of one example of a gas barrier film according to the present invention.

FIG. 1 is a typical cross-sectional view of one example of a gas barrier film according to the present invention.

A gas barrier film 1 comprises a plastic film 2 having an oligomer content of not more than 1% by weight, an organic layer 3 provided on the plastic film 2, and an inorganic layer 4 provided on the organic layer 3, and the thickness of the organic layer 3 is larger than the maximum difference in elevation (not shown) on the surface of the plastic film 2. The reduction in oligomer content of the plastic film 2 makes it easy to form an inorganic layer 4 having a good film quality and, by virtue of the reduced oligomer content, even when the maximum difference in elevation of the plastic film 2 surface is increased, the organic layer 3 covers the maximum difference in elevation to flatten the surface and the inorganic layer 4 is provided on the flattened organic layer 3. As a result, a gas barrier film 1 that is excellent particularly in gas barrier properties can be provided. Each member constituting the gas barrier film 1 will be described.

The plastic film 2 has an oligomer content of not more than 1% by weight. From the viewpoint of good inorganic layer 4 formation, the oligomer content is preferably not more than 0.8% by weight, more preferably not more than 0.7% by weight. A plastic film 2 having a low oligomer content is sometimes called "a hydrolysis-resistant film." When an oligomer is present in the plastic film 2, gas is evolved from the plastic film 2 in the formation of the inorganic layer 4 by vacuum layer formation. Accordingly, the layer formation is hindered, and the thickness of the inorganic layer 4 is likely to be small, making it difficult to obtain a good layer quality. In the present invention, the oligomer content is reduced to suppress the hindrance of the formation of the inorganic layer 4 and thus to realize a proper thickness of the inorganic layer 4 and a good layer quality. The oligomer content of the plastic film is preferably not less than 0.01% by weight, more preferably not less than 0.1% by weight, particularly preferably not less than 0.2% by weight. When the oligomer content is excessively low, the flexibility of the plastic film per se is so low that there is a possibility that the application to a roll process becomes difficult or that a trouble occurs in a later step.

The oligomer contained in the plastic film 2 collectively refers to, for example, monomers remaining unreacted, oligomers, and low-molecular compounds such as reaction by-products in the formation of the plastic film 2 and are not necessarily limited to pure oligomers. More specifically, all substances (substances that contribute to weight reduction) detected as an oligomer component by a method for measuring an oligomer content which will be described later are oligomers referred to in the present invention.

The oligomer content of the plastic film 2 may be measured by various methods. An example of a preferred method comprises immersing a plastic film as a sample in heated xylene for 24 hr and to determine the amount of an oligomer component extracted in xylene by a weight change of the sample. More specifically, a method described in Japanese Patent Laid-Open No. 288622/1999 may be used. Specifically, the oligomer content may be determined as follows. Sample films (16 samples) cut into a size of 50 mm square are dried in a hot-air oven of 140° C. for 2 hr, and the weight of the dried samples is measured. Next, the samples are extracted with boiling xylene in a Soxhlet extractor for 24 hr. The extracted samples are taken out and washed in an ultrasonic bath containing water for 6 min, and this step is repeated thrice, and xylene adhered on the surface of the samples is lightly wiped off with a gauze. Finally, the extracted samples are dried in a hot-air oven of 160° C. for 8 hr, and the weight (weight after extraction) of the samples is measured. The oligomer content is determined by the following calculation equation: Oligomer content (%)=100× (weight before extraction−weight after extraction)/weight before extraction.

The plastic film 2 may be formed of any plastic without particular limitation. Examples of preferred plastics for the plastic film 2 include polyester resins from the viewpoint of general-purpose properties and industrial efficiency. Such polyester resins include, for example, polyethylene terephthalate (PET), polybutylene terephthalate (PBT), polyethylene naphthalte (PEN), and copolymers thereof and polycyclohexane dimethylene terephthalte (PCT). Among the polyester resins, polyethylene terephthalate (PET), polyethylene naphthalate (PEN), and copolymers thereof are preferred. Polyethylene terephthalate and copolymers thereof are further preferred, and polyethylene terephthalate is particularly preferred. That is, the plastic film 2 is particularly preferably formed of polyethylene terephthalate. Polyethylene terephthalate is likely to be crystallized. This property is more clearly exposed by reducing the oligomer content. As a result, the roughness of the surface of the plastic film 2 formed of polyethylene terephthalate, of which the oligomer content has been reduced, is likely to be increased, and, accordingly, the usefulness of the smoothing of the surface by the organic layer 3 is enhanced.

Specific examples of polyethylene terephthalate, of which the oligomer content has been reduced, include X10S (tradename) manufactured by Toray Industries, Inc., VN, VW, and VK (all of them being tradenames) manufactured by Teijin DuPont Films Japan Limited, and P100 (tradename) manufactured by Mitsubishi Plastics Inc.

The thickness of the plastic film 2 is not particularly limited as long as a predetermined rigidity can be imparted to the gas barrier film 1, and the thickness of the plastic film 2 is generally not less than 10 µm, preferably not less than 50 µm, and is generally not more than 5 mm, preferably not more than mm, more preferably not more than 1 mm, still more preferably not more than 500 µm, particularly preferably not more than 300 µm. When the thickness of the plastic film 2 is not more than 300 µm, the nonuniformity of the thickness of the plastic film stretched in a film forming step in the plastic film provision step can be reduced. Further, when the thickness of the plastic film 2 is not more than 300 µm, the rigidity is lowered and, further, when the formation of the inorganic layer 4 by a roll-to-roll method is followed by winding-up in a roll form, cracking or scratching of the inorganic layer 4 is less likely to occur. Further, when the gas barrier film 1 is used as the backside protective sheet for a solar battery module, since there is a strong demand for low price products in the market, bringing the thickness of the plastic film 2 to not more than 300 µm can reduce the amount of the raw material of the plastic film 2 used, contributing to a cost reduction.

The thickness of the plastic film can be evaluated by measuring the thickness of the film when obtained. On the other hand, the thickness of the plastic film after the construction of the gas barrier film is measured by machining the gas barrier film with a focused ion beam machining apparatus (FIB: FB-2000, manufactured by Hitachi, Ltd.) to expose the cross-sectional surface of the plastic film and observing the cross-sectional surface under a scanning electron microscope (SEM: S-5000H, manufactured by Hitachi, Ltd.; accelerating voltage 1.5 kV). In this case, any 6 places in the cross-sectional surface of the plastic film are selected for the measurement, and an average of the measured data is adopted as the thickness of the plastic film.

The plastic film 2 has a rough surface due to a reduction in oligomer content although the rough surface state is not shown in FIG. 1. Any mechanism through which concaves and convexes of the surface of the plastic film 2 are increased by reducing the oligomer content of the plastic film 2 has not been elucidated yet. However, since a plastic film 2 having large surface concaves and convexes is likely to be whitened, the mechanism is expected to be as follows.

The whitening phenomenon of the plastic film 2 is considered to occur due to partial crystallization of molecular chains in the plastic film 2 that causes two different areas of crystallized areas and noncrystallized areas that are different from each other in optical refraction index. It is considered that the formation of surface concaves and convexes are induced by the growth or the like of the crystallized areas that renders the crystallized areas concave or convex. Easiness of crystallization varies depending upon the shape of polymer molecules constituting the plastic film 2. A polymer having a simple and regular molecular structure is likely to crystallize. For example, when the plastic film 2 of polyethylene terephthalate is used, the polyethylene terephthalate belongs to crystallizable plastics and is inherently likely to crystallize. For this reason, when a transparent film is formed from the polyethylene terephthalate, a measure is taken in the formation of the film. For example, the polyethylene terephthalate is brought to a temperature at or above the melting point followed by rapid cooling to obtain a noncrystalline state. Thus, the polyethylene terephthalate per se is likely to crystallize. The plastic film 2 of polyethylene terephthalate having a lowered oligomer content is considered to be more likely to crystallize. The reason for this is believed to reside in that a reduction in the amount of the unreacted component such as oligomers allows the original properties of the crystalline plastic to be likely to be developed through an improvement in purity of the resin composition as well as in regularity. That is, it is considered that, in many cases, in order to lower the oligomer content, pellets of polyethylene terephthalate that have been once obtained are further reacted by a solid phase polymerization method or the like to lower the content of the unreacted component, and, hence, crystallization, that is, whitening, is likely to occur through an improvement in purity of the resin composition as well as in regularity.

As described above, the plastic film 2 has a lowered oligomer content and thus has a predetermined surface roughness. The surface roughness of the plastic film 2 is substantially proportional to the thickness of the plastic film 2. Specifically, the maximum difference in elevation of profile peaks and valleys in the surface of the plastic film 2 is likely to increase with an increase in thickness of the plastic film 2. When these points are taken into consideration, the maximum difference in elevation of profile peaks and valleys in the surface of the plastic film 2 is generally not less than 0.7 μm and not more than 5 μm. For example, as described in working examples that will be described later, when the plastic film 2 has a thickness of not more than 300 μm, the maximum difference in elevation is 1.6 μm and, thus, the thickness of the organic layer 3 is preferably not less than 1.7 μm.

The maximum difference in elevation as the surface roughness may be evaluated by measuring a level in an area in a range of 0.13 mm×0.17 mm with a surface profile measuring apparatus (SP-500, manufactured by Toray Engineering Co., Ltd.) under conditions of a lens magnification of 50 times and a resolution of 1376×1040 pixels and determining the difference between the maximum level value and the minimum level value as the maximum level difference. On the other hand, the maximum level difference as the surface roughness of the plastic film after the construction of the gas barrier film may be measured by machining a gas barrier film with a focused ion beam machining apparatus (FIB: FB-2000, manufactured by Hitachi, Ltd.) to expose a cross-sectional surface of the plastic film and observing the cross-sectional surface under a scanning electron microscope (SEM: S-5000H, manufactured by Hitachi, Ltd., acceleration voltage 1.5 kV). In this case, any 6 places in the cross-sectional surface of the plastic film are measured, and, among the obtained data, the maximum level difference value is adopted.

The surface of the plastic film 2 may be treated, for example, by corona treatment, flame treatment, plasma treatment, glow discharge treatment, roughening treatment, heating treatment, chemical treatment, and easy-adhesion treatment. Specific surface treatment methods may be proper conventional methods.

A process for producing the plastic film 2, specifically a process for producing a plastic film 2 having a predetermined oligomer content, will be described later.

The organic layer 3 is formed so as to cover the surface roughness of the plastic film 2. That is, the organic layer 3 is formed so that the thickness of the organic layer 3 is larger than the maximum difference in elevation on the surface of the plastic film 2.

The material for the formation of the organic layer 3 is not particularly limited as long as the organic layer 3 is formed from an organic material. Examples of preferred organic materials include heat-curable resins and ultraviolet-curable resins. Among them, ultraviolet-curable resins are preferred when productivity on a commercial scale is taken into consideration. Specifically, when heat-curable resins are used, heating at about 160° C. is necessary for curing, and, thus, the plastic film 2 should be heat-resistant. Therefore, the scope of choices of materials for the formation of the plastic film 2 is somewhat narrowed. Further, when heat-curable resins are used, a given curing time (for example, about 30 min) is necessary. Accordingly, this sometimes makes difficult to ensure a satisfactory drying time in a production process of a roll-to-roll system. In this case, for more reliable curing purposes, in some cases, the plastic film is wound around a roll and, in this state, is introduced into a heating oven. Due to the form of a roll wound state, a problem of blocking or uneven curing, that is, a difference in degree of curing between the outer side of the film roll and the near-center portion of the film roll, is likely to occur. On the other hand, the ultraviolet-curable resin can be satisfactorily cured by applying light at a necessary exposure. Accordingly, the necessary curing time is short, and a good organic layer 3 can be formed on the plastic film 2 on a commercial scale.

When the organic layer 3 is formed of an ultraviolet-cured resin, the organic layer 3 is formed by coating an ultraviolet-curable resin composition on the plastic film 2, irradiating the coating film with ultraviolet light to cure the ultraviolet-curable resin. The method for the formation of the organic layer 3 will be described later. Materials usable for the ultraviolet-curable resin composition will be described.

Ultraviolet-curable resin compositions for the formation of the organic layer 3 are not particularly limited. However, resins composed mainly of an acrylic monomer are preferred. Specific examples of resins composed mainly of an acrylic monomer include resins containing acrylate functional groups, for example, oligomers or prepolymers and reactive diluents, for example, relatively low-molecular weight polyester resins, polyether resins, acrylic resins, epoxy resins, urethane resins, alkyd resins, spiroacetal resins, polybutadiene resins, and polythiol polyene resins and (meth)acrylates of polyfunctional compounds such as polyhydric alcohols. Specific examples thereof include monofunctional monomers such as ethyl(meth)acrylate, ethylhexyl(meth)acrylate, styrene, methylstyrene, N-vinylpyrrolidone; and polyfunctional monomers, for example, polymethylolpropane tri(meth)acrylate, hexanediol(meth)acrylate, tripropylene glycol di(meth)acrylate, diethylene glycol di(meth)acrylate, pentaerythritol tri(meth) acrylate, dipentaerythritol hexa(meth)acrylate, 1,6-hexanediol di(meth)acrylate, and neopentyl glycol di(meth)acrylate. The term "(meth)acrylate" as used therein means acrylate or methacrylate.

Further, polymerization initiators, for example, acetophenones, benzophenones, Michler's benzoyl benzoate, α-amyloxime ester, tetramethyl thiuram monosulfide, or thioxanthones, or photosensitizers such as n-butylamine, triethylamine, or tri-n-butylphosphine may be mixed into the ultraviolet-curable resin composition for the formation of the organic layer 3. The content of the polymerization initiator and the photosensitizer in the ultraviolet-curable resin composition is not particularly limited, and the content may be on such a level that the composition can be cured satisfactorily. The ultraviolet-curable resin composition may contain a solvent such as toluene or methyl ethyl ketone from the viewpoint of viscosity adjustment of the coating liquid. The solvent may be mixed at any ratio that falls within the scope of the subject matter of the present invention.

The thickness of the organic layer 3 is preferably not less than 1.7 μm and not more than 10 μm. The thickness in this range can allow the maximum difference in elevation on the surface of the plastic film 2 to be more reliably covered by the organic layer 3, whereby the gas barrier properties of the gas barrier film 1 can be more reliably improved. For example, as described in working examples that will be described later, when the plastic film 2 has a thickness of not more than 300 μm, the maximum difference in elevation is 1.6 μm at the maximum. Accordingly, the thickness of the organic layer 3 is preferably not less than 17 μm. For example, when the organic layer 3 is an ultraviolet-cured resin layer formed from an ultraviolet-curable resin, the thickness of the organic layer 3 is preferably not less than the maximum difference in elevation of the plastic film 2 and the upper limit of the thickness of the organic layer 3 is not more than 10 μm. The thickness of the organic layer 3 can be measured by machining a gas barrier film 1 with a focused ion beam machining apparatus (FIB: FB-2000, manufactured by Hitachi, Ltd.) to expose a cross-sectional surface of the organic layer and observing the cross-sectional surface under a scanning electron microscope (SEM: S-5000H, manufactured by Hitachi, Ltd.; accelerating voltage 1.5 kV). In this case, any 6 places in the cross-sectional surface of the organic layer were selected for the measurement, and the average of the obtained data was adopted.

When the thickness of the organic layer 3 is smaller than the maximum difference in elevation in the surface roughness of the plastic film 2, the surface of the plastic film 2 cannot be satisfactorily flattened and cannot be completely covered by the organic layer 3, making it difficult to evenly form an inorganic layer 4 on the whole surface of the organic layer 3. Accordingly, areas where the inorganic layer has not been formed have unsatisfactory gas barrier properties. From this viewpoint, the thickness of the organic layer 3 is preferably not less than 1.7 μm. On the other hand, for example, when curling of the plastic film 2 and cracking of the organic layer 3 are taken into consideration, the thickness of the organic layer 3 is preferably not more than 10 μm.

The inorganic layer 4 is formed as a layer that shields gas such as water vapor. The material for the formation of the inorganic layer 4 is not particularly limited as long as the material is an inorganic compound. Examples of such inorganic compounds include metals, inorganic oxides, inorganic oxynitrides, inorganic nitrides, inorganic oxycarbides, or inorganic oxycarbonitride. The inorganic layer 4 may also be formed of a mixture of the above materials at any ratio that falls within the scope of the subject matter of the present invention. A thin film formed by these materials is likely to shield water vapor permeation and to shield oxygen permeability and thus can effectively impart a gas barrier function.

More specifically, from the viewpoint of gas barrier properties, the inorganic compound constituting the inorganic layer 4 contains one or at least two of silicon, aluminum, magnesium, titanium, tin, indium, or cerium. Still more specifically, from the viewpoint of gas barrier properties, examples of preferred inorganic oxides include silicon oxides, aluminum oxides, magnesium oxides, titanium oxides, tin oxides, or indium alloy oxides. The inorganic oxynitride is preferably a silicon oxynitride. The inorganic nitride is preferably a silicon nitride, an aluminum nitride, or a titanium nitride. The metal of the base material thin film is preferably aluminum, silver, tin, chromium, nickel, or titanium. The inorganic layer 4 may be formed of a mixture of the above materials at any ratio that falls within the scope of the subject matter of the present invention.

The thickness of the inorganic layer 4 may vary depending upon the inorganic compound used but is generally not less than 5 nm, preferably not less than 10 nm, from the viewpoint of ensuring gas barrier properties. The thickness of the inorganic layer 4 is generally not more than 5000 nm, preferably not more than 500 nm, more preferably not more than 300 nm, from the viewpoint of suppressing the occurrence of cracking and the like. The inorganic layer 4 is not limited to a single-layer structure and may have a multilayer structure of two or more layers. In the multilayer structure, the layers may be formed of an identical material, or alternatively may be different from each other in material.

The method for the formation of the inorganic layer 4 will be described in more detail later.

As described above, the gas barrier film 1 comprises a plastic film 2, an organic layer 3, and an inorganic layer 4. A layer other than these layers may be properly inserted into between the plastic film 2 and the organic layer 3 or between the organic layer 3 and the inorganic layer 4, may be stacked on the plastic film 2 in its side remote from the organic layer 3, and may be stacked on the inorganic layer 4. Such optional layers include, for example, a primer layer and an overcoat layer. The primer layer and the overcoat layer may be proper conventional ones.

Since the gas barrier film 1 comprises a plastic film 2 having a lowered oligomer content, an organic layer 3 having a thickness large enough to cover the maximum difference in elevation on the surface of the plastic film 2, and an inorganic layer 4 that contributes to gas barrier properties, a high level of gas barrier properties can be provided. Specifically, a high gas barrier property level of not more than $10^{-2}$ g/m$^2$·day (not more than 0.01 g/m$^2$·day) can be provided. The gas barrier properties can be evaluated, for example, by measuring water vapor permeability. An example of the measuring method is to measure the water vapor permeability with a water vapor permeability measuring apparatus (tradename: AQUATRAN, manufactured by MOCON) under conditions of a measuring temperature of 37.8° C. and a humidity of 100% RH.

<Device>

The device according to the present invention comprises the above gas barrier film and is a display device or a power generating device. Thus, the gas barrier film according to the present invention can be utilized in a display device or a power generating device that is required to have a high gas barrier property level of not more than $10^{-2}$ g/m$^2$·day (not more than 0.01 g/m$^2$·day). Therefore, a device comprising a gas barrier film having excellent gas barrier properties can be provided.

The display device is one that, when water vapor or the like permeates into the device, causes a deterioration in display performance and hence should be used in combination with a gas barrier film. Such display devices include, for example, liquid crystal display devices, and organic EL display devices. The liquid crystal display device and the organic EL display device may have a conventional construction, and any proper conventional method may be used for sealing with the gas barrier film.

The power generating device is one that, when water vapor or the like permeates into the device, causes a deterioration in power generation performance and hence should be used in combination with a gas barrier film. Such power generating devices include, for example, solar battery devices (solar battery modules). The power generating device may have a conventional construction, and any proper conventional method may be used for sealing with the gas barrier film. More specifically, the gas barrier film is usually used as a backside protective sheet for solar battery devices because gas barrier properties that can shield the permeation of water vapor (moisture) or oxygen from outside are required of the backside protective sheet. When the gas barrier properties are unsatisfactory, the permeation of water vapor (moisture) sometimes causes a lowered output of the solar battery, for example, due to separation or color change of fillers constituting the solar battery device or corrosion of wiring. Accordingly, the use of the gas barrier film according to the present invention, having particularly excellent gas barrier properties, is of great significance.

The use of the gas barrier film according to the present invention in power generating devices, more specifically solar battery devices, offers another advantage. Specifically, in the gas barrier film according to the present invention, since the plastic film has a lowered oligomer content, whitening occurs due to partial crystallization causative of surface concaves and convexes. The whitening causes irregular reflection of sunlight applied to the solar battery device to improve an irradiation efficiency, whereby the power generation efficiency of the solar battery device is likely to be improved. From this viewpoint as well, the gas barrier film according to the present invention is preferably used in power generating device typified by solar battery devices.

<Process for Producing Gas Barrier Film>

The process for producing a gas barrier film according to the present invention comprises a plastic provision step of providing a plastic film having an oligomer content of not more than 1% by weight; an organic layer formation step of forming an organic layer on the plastic film, the organic layer having a thickness that is larger than a maximum difference in elevation on the surface of the plastic film; and an inorganic layer formation step of forming an inorganic layer on the organic layer. According to the above construction, a lowered oligomer content of the plastic film is advantageous in that an inorganic layer having a good layer quality is likely to be formed and that, even when the maximum difference in elevation on the surface of the plastic film is increased, the organic layer covers the maximum difference in elevation to flatten the surface and the inorganic layer can be provided on the flattened organic layer. As a result, a production process that can produce a gas barrier film having excellent gas barrier properties can be provided. Each step of the production process will be described.

At the outset, the plastic film provision step will be described.

The plastic film provision step is a step of providing a plastic film having an oligomer content of not more than 1% by weight. More specifically, the plastic film provision step is carried out, for example, by producing the predetermined plastic film or by purchasing the predetermined plastic film produced by a film manufacturer or the like. The plastic film having a lowered oligomer content may be produced by any method without particular limitation. For example, when thermoplastic resins typified by polyester resins are used as a material for the plastic film, the following steps may be carried out. Specifically, the step of reducing the amount of an oligomer component of a thermoplastic resin or the like (an oligomer component reduction step) may be followed by the step of melting the thermoplastic resin and forming the melt into a film (a film formation step). The oligomer component reduction step and the film formation step will be described.

The starting material used in the oligomer component reduction step is a thermoplastic resin. The thermoplastic resin is synthesized in the presence of a polymerization catalyst. Antimony compounds such as antimony trioxide $Sb_2O_3$ are generally used as the polymerization catalyst. Polymerization catalysts such as compounds containing at least one material selected from Ge, Ti, Co, Zn, and Al, for example, germanium oxide and titanium oxide, are preferred because the resultant starting material is likely to undergo an oligomer reduction, for example, due to a low oligomer regeneration rate and a deactivation treatment effect of the catalyst.

The number of repeating units of the thermoplastic resin as the starting material used in the oligomer component reduction step is preferably not less than 80, more preferably not less than 120. The intrinsic viscosity of the thermoplastic resin as measured in o-chlorophenol (OCP) is preferably not less than 0.5 (dl/g), more preferably not less than 0.6 (dl/g). The intrinsic viscosity is particularly preferably not less than 0.7 (dl/g) achieved by reducing the amount of the oligomer component by solid-phase polymerization.

In the oligomer component reduction step, the starting material thus provided is used in a pellet or powder form. More specifically, the starting material may be in the form of pellets having a size of 2 to 4 mm square. Preferably, the starting material is in a form having a large specific surface area such as a powder having a size of not less than 1 μm and not more than 1 mm from the viewpoint of reducing the specific surface area to easily remove the oligomer component. When the powdery starting material is used, the treatment time necessary for the reduction and removal of the oligomer component can easily be shortened and the extraction efficiency can also be easily improved. In the use of the powdery starting material, the smaller the average particle diameter of the powder, the better the extraction of the oligomer. On the other hand, the larger the average particle diameter of the powder, the better the handleability. From these viewpoints, the average particle diameter of the powder is more preferably not less than 10 μm and not more than 500 μm. When the powdery starting material is used, the average particle diameter may be measured by any method without particular limitation. An example of the most practical measurement method is a static scattering method using argon or helium laser beams. In grinding the starting material pellets to prepare a powdery starting material, the starting material pellets may be ground by any method without particular limitation. A cooling grinding method (a freeze grinding method) is generally used. Examples of freeze grinding methods include methods using conventional colloid mills, jet grinding machines, ball mills, roll mills, and impact atomizers. One of or a combination of the above methods may be properly used.

In the oligomer component reduction step, an attempt is made to remove the oligomer component from the starting material. The oligomer component may be reduced and removed by any method without particular limitation. From the viewpoint of reducing an environmental load while improving a production efficiency, preferably, the starting material is treated in a supercritical gaseous state. Since the supercritical gas is a good solvent for the oligomer, the amount of the oligomer content can be reduced by treatment in a supercritical gas. The supercritical state refers to a state that simultaneously has a diffusion property of, for example, gas and an extraction property of, for example, a liquid at or above a certain temperature and at or above a certain pressure. For carbon dioxide, a supercritical gas state is provided at or above 31.3° C. and at or above 72.9 atm. The gas used is not particularly limited. Gases having a critical temperature of 300° C. or below and a critical pressure of 500 atm or below are preferred. Examples of such gases include carbon monoxide, carbon dioxide, ammonia, nitrogen, water, methanol, ethanol, ethane, propane, butane, benzene, and diethyl ether. Among these gases, carbon dioxide and ethane are preferred from the viewpoint of a low supercritical temperature.

In the oligomer component reduction step, as described above, a supercritical gas functions as a good solvent for the oligomer. When an entrainer that does not dissolve the thermoplastic resin is allowed to exist together with the supercritical gas and the starting material, the oligomer can be better extracted. The entrainer used is not particularly limited and may be properly selected depending upon the thermoplastic resin used. For example, when the thermoplastic resin is a polyethylene terephthalate resin, preferred entrainers are halogenated hydrocarbons such as chloroform; aromatic hydrocarbons such as benzene, toluene, xylene, and ethylbenzene; and ethers such as dioxane and tetrahydrofuran. Among these entrainers, dioxane is more preferred from the viewpoints of improved production efficiency, reduced environmental load, easy handling and the like. The mixing ratio of the entrainer is not particularly limited but is preferably not less than 10% relative to the supercritical gas from the viewpoints of realizing better oligomer extraction.

In the oligomer component reduction step, when the supercritical gas is used, the treatment temperature is the supercritical temperature or above. When the starting material used is a thermoplastic resin, from the viewpoint of easiness to handle of the starting material, preferably, a thermoplastic resin having a melting point of Tm or below and a glass transition temperature of Tg or above is used while the treatment temperature is the supercritical temperature or above. The pressure of a system using the supercritical gas may be a supercritical pressure or above. From the viewpoint of improving an extraction rate, however, treatment at a higher possible pressure is preferred. For example, when carbon dioxide is used as the gas, the pressure may be approximately 100 atm and is preferably not less than 300 atm, more preferably not less than 400 atm. When the pressure is in the above range, the extraction rate can be increased. The time for treatment with the supercritical gas may vary depending upon the extraction amount and is not less than one hr and not more than 10 hr when production on a commercial scale is taken into consideration.

In the oligomer component reduction step, when treatment with a supercritical gas is carried out, the supercritical gas treatment may be carried out in a treatment apparatus of a closed system, or alternatively, may be carried out in a treatment apparatus of a system that allows the starting material, the supercritical gas and the like to be continuously introduced thereinto or discharged therefrom. From the viewpoint of easy production on a commercial scale, preferably, treatment is carried out in a system that allows the starting material, the supercritical gas and the like to be continuously introduced thereinto or discharged therefrom. More specifically, preferably, a circulation-type treatment apparatus is used that can allow a resin starting material to be continuously introduced into a treatment oven and to be continuously discharged from the treatment oven, and, while a fresh supercritical gas and an entrainer mixed gas are supplied in the treatment oven, the extracted gas is discharged from the treatment oven and the oligomer is recovered and purified followed by the use of the recovered gas as the supercritical gas.

In the film forming step, the resin having a low oligomer content obtained by the oligomer component reduction step is if necessary subjected to dehydration, drying and heat treatment and is then generally melted and molded (melt-extruded) at or above the melting point Tm of the resin into a plastic film. The melt extrusion may be carried out by any extruder such as uniaxial, biaxial vent, tandem extruders and the like. The nozzle may also be of any shape such as a ring die, a T die, a coat hanger die, a fish tail die, or an L die. In the melt extrusion, from the viewpoint of removing foreign materials contained in the molten starting material, the molten resin is generally extruded while being filtered through a proper filter, for example, a sintered metal, a porous ceramic, a sand, or a metallic gauze.

In the film forming step, from the viewpoints of elimination of nozzle streaks or stable casting, preferably, a resin sheet in a molten state is extruded through a nozzle in a vertical direction. More preferably, the direction of the nozzle land is also vertical. Further, the positional relationship between a nozzle and a cast drum is not particularly limited. Preferably, however, for example, from the viewpoints of thickness evenness and freedom from surface defects, the nozzle is located above the direction of travel of the sheet, still preferably at such a position that the vertical direction is a tangential line of the drum, rather than at the top of the casting drum. For this reason as well, the shape of the nozzle is preferably a coronoid type having a sharp front end. The draft ratio (=nozzle lip spacing/thickness of extruded sheet) in the extrusion of a molten sheet through the nozzle is preferably not less than 3, more preferably not less than 5 and is not more than 20, because unevenness of the thickness is so small that a sheet having a good flatness can easily be provided.

In the film forming step, preferably, the extruded plastic film having a low oligomer component content is then heated with a roll in a roll-type longitudinal stretching machine to Tg or above and is stretched by a factor of about 1.5 to 7. The following method is then preferably adopted. The film is guided to a tenter-type cross-direction stretching machine for widthwise stretching. Both ends are held by clips, the sheet is heated to Tg or above by hot air, and the width of the clips at the both ends of the sheet is increased to stretch the sheet in a lateral direction (a widthwise direction) by a factor of 2 to 8. Further, in order to provide a sheet having a high strength in a longitudinal direction, the sheet may be again roll-stretched in the longitudinal direction. It is a matter of course that a simultaneous biaxial stretching method may be adopted in which the sheet is stretched simultaneously in the longitudinal and widthwise directions.

Next, the organic layer formation step will be described.

The organic layer formation step is a step of forming an organic layer having a larger thickness than the maximum difference in elevation on the surface of the plastic film on the plastic film. The organic layer is preferably formed from an ultraviolet-curable resin. The use of the ultraviolet-curable resin is advantageous in that, as compared with heat-curable resins, a heat load to the plastic film in the organic layer formation can be lowered and, thus, the scope of choice of the material for the plastic film can be increased. Further, when the organic layer is formed by a roll-to-roll system, in the case of the heat-curable resin, further drying is necessary after winding around a roll, leading to a possibility that blocking of the organic layer occurs. On the other hand, in the ultraviolet-curable resin, the above phenomenon can be suppressed. Further, it should be noted that, when the heat-curable resin is used, a problem of uneven curing, that is, a difference in degree of curing of the organic layer between the outer side of the film roll and the near-center portion of the film roll, is likely to occur. When the ultraviolet-curable resin is used, this tendency is likely to be suppressed.

In the organic layer formation step, when the organic layer is formed from the ultraviolet-curable resin, the organic layer may be formed by coating an ultraviolet-curable resin composition on a plastic film and exposing the coating film with ultraviolet light to cure the ultraviolet-curable resin. The ultraviolet-curable resin composition may be as described in the column of "gas barrier film" and, thus, the description of the ultraviolet-curable resin composition will here be omitted for the avoidance of repetition of the description.

In the organic layer formation step, the ultraviolet-curable resin composition may be coated by any method without particular limitation, and examples of coating methods usable herein include conventional coating methods such as roll coating, gravure roll coating, kiss roll coating, reverse roll coating, Mayer bar coating, gravure coating, spin coating, and die coating.

In the organic layer formation step, the ultraviolet-curable resin composition is coated on the plastic film, and the coating is if necessary dried and is then cured by irradiation with ultraviolet light. The coating may be dried at room temperature. When the ultraviolet-curable resin composition contains a solvent, preferably, the coating is dried at or above the boiling point of the solvent. The drying time may be properly regulated from the viewpoint of reliably removing an optionally added solvent while taking productivity on a commercial scale into consideration. Curing by ultraviolet light may be carried out by ultraviolet irradiation from an ultraviolet light source. Examples of ultraviolet light sources include light sources such as ultra-high-pressure mercury lamps, high-pressure mercury lamps, low-pressure mercury lamps, carbon arc lamps, blacklight fluorescent lamps, and metal halide lamps. Regarding the wavelength of the ultraviolet light, a wavelength range of 190 to 380 nm may be used. The ultraviolet irradiation time may be properly regulated from the viewpoint of reliably curing the organic layer while taking productivity on a commercial scale into consideration.

The inorganic layer formation step will be described.

The inorganic layer formation step is a step of forming an inorganic layer on the organic layer. The material for the inorganic layer formation may be as described in the column of "gas barrier film" and, thus, the description of the material for the inorganic layer formation will here be omitted for the avoidance of repetition of the description.

In the inorganic layer formation step, the inorganic layer is formed by depositing the predetermined material described above on the organic layer. The method for inorganic layer formation is not particularly limited. From the viewpoint of productivity on a commercial scale, however, physical vapor deposition methods such as vacuum deposition, sputtering, and ion plating and plasma chemical vapor deposition methods are preferred. In such various formation methods, the inorganic layer may be formed under conditions adopted by properly regulating conventional conditions for layer formation while taking into consideration, for example, the properties and thickness of the contemplated inorganic layer.

A more specific example of the method for inorganic layer formation in the inorganic layer formation step is a vacuum deposition method that comprises providing a starting material such as an inorganic oxide, an inorganic nitride, an inorganic oxynitride, or a metal and heating the starting material to deposit the material on a base material. Another example of the method for inorganic layer formation is an oxidation reaction vapor deposition method that comprises introducing oxygen gas into the starting material to oxidize the starting material and depositing the oxidized starting material on a base material. Still another example of the method for inorganic layer formation is a sputtering method that comprises providing the above starting material as a target material, introducing argon gas or oxygen gas and sputtering the target material to deposit the target material on a base material. A further example of the method for inorganic layer formation is an ion plating method that comprises heating the above starting material by plasma beams generated using a plasma gun to deposit the starting material on a base material. When a vapor-deposited film of silicon oxide is formed, a plasma chemical vapor deposition method using an organic silicon compound as a starting material may also be utilized.

The process for producing a gas barrier film according to the present invention comprises a plastic film provision step, an organic layer formation step, and an inorganic layer formation step. Other steps may be additionally provided. Examples of such steps include a primer layer formation step and an overcoat layer formation step. These various steps may be carried out by properly adopting conventional methods.

EXAMPLES

The present invention is further illustrated by the following Examples that are not intended as a limitation of the invention, unless it extends beyond the subject matter of the present invention.

Example 1

<Plastic Film Provision Step>

A 50 μm-thick polyester film (PET film manufactured by Toray Industries, Inc., tradename: Lumirror X10S (Lumirror being a registered trademark), oligomer content: 0.65% by weight) was used. For the oligomer content (amount of oligomer), reference was made to a homepage of Toray Industries, Inc. (http://www.toray.jp/films/properties/lumirror/lum_x10s.html). In the homepage, there is a description to the effect that analysis of oligomer is "xylene 24 HR," and it is considered that the analysis was carried out according to the following method described in a laid-open application publication of Toray Industries, Inc. (Japanese Patent Laid-Open No. 288622/1999). At the outset, 16 sheets of film samples cut into a size of 50 mm square are dried in a hot-air oven of 140° C. for 2 hr, and the weight (weight before extraction) is then measured. The dried samples are then extracted with boiling xylene (500 ml) using a Soxhlet's extractor for 24 hr. Thereafter, the extracted samples are taken out and are washed with an ultrasonic washer containing water for 6 min. The above procedure is repeated thrice, and xylene deposited on the surface of the samples is lightly wiped off with a gauze. Finally, the extracted samples are dried in a hot-air oven of 160° C. for 8 hr, and the weight (weight after extraction) of the samples is measured. The oligomer content is determined by a calculation formula of "Oligomer content (%)=100×(weight before extraction−weight after extraction)/weight before extraction."

The oligomer content for each grade of plastic films described in the homepage of Toray Industries, Inc. (http://www.toray.jp/films/properties/lumirror/lum_x10s.html) is transcribed to Table-1 below.

TABLE 1

Oligomer content for each grade/thickness of plastic films (weight %)

| Grade | Thickness (μm) | | | | | |
|---|---|---|---|---|---|---|
| | 50 | 75 | 125 | 188 | 250 | 300 |
| ×10S | 0.65 weight % | 0.55 weight % | 0.53 weight % | 0.50 weight % | 0.46 weight % | 0.37 weight % |
| S10 | — | — | — | — | 1.4 weight % | — |

The roughness (maximum level difference) of the surface of the plastic film was evaluated by measuring a level in an area in a range of 0.13 mm×0.17 mm with a surface profile measuring apparatus (SP-500, manufactured by Toray Engineering Co., Ltd.) under conditions of a lens magnification of 50 times and a resolution of 1376×1040 pixel and determining the difference between the maximum level value and the minimum level value as the maximum level difference. As a result, the maximum level difference of the plastic film was 1.3 μm. The maximum level difference as the surface roughness of the plastic film after the construction of the gas barrier film may be measured by machining a gas barrier film with a focused ion beam machining apparatus (FIB: FB-2000, manufactured by Hitachi, Ltd.) to expose a cross-sectional surface of the plastic film and observing the cross-sectional surface under a scanning electron microscope (SEM: S-5000H, manufactured by Hitachi, Ltd., acceleration voltage 1.5 kV). In this case, any 6 places in the cross-sectional surface of the plastic film are measured, and, among the obtained data, the maximum level difference value is adopted.

<Organic Layer Formation Step>

An ultraviolet curable resin composition (an ink for an ultraviolet cured organic layer) adjusted to have the following composition was die-coated on one surface of the plastic film. The coating was dried at 120° C. for 2 min. The dried coating was irradiated with ultraviolet light under conditions of a cumulative light quantity of 300 mJ/cm$^2$ in a wavelength range of 260 nm to 400 nm to form a 5 μm-thick organic layer. The thickness of the organic layer was measured by machining a gas barrier film with a focused ion beam machining apparatus (FIB: FB-2000, manufactured by Hitachi, Ltd.) to expose a cross-sectional surface of the organic layer and observing the cross-sectional surface under a scanning electron microscope (SEM: S-5000H, manufactured by Hitachi, Ltd.; accelerating voltage 1.5 kV).

In this case, any 6 places in the cross-sectional surface of the organic layer were selected for the measurement, and an average of the measured values was adopted as the thickness of the organic layer.

<Composition of Ink for Ultraviolet Cured Organic Layer>

Polyester acrylate oligomer: 39 parts by weight (Aronix M-8060, manufactured by TOAGOSEI CO., LTD.)

Toluene/methyl ethyl ketone (1/1) mixed solvent: 60 parts by weight

Oligo[2-hydroxy-2-methyl-[1-(4-methylvinyl)phenyl]propanone] (photopolymerization initiator: Esacure One, manufactured by Lamberti): 1 part by weight <Inorganic Layer Formation Step>

An inorganic layer was formed by a sputtering film formation. Specifically, the plastic film with the organic layer formed thereon was installed within a chamber of a batch-type sputtering apparatus (SPF-530H, manufactured by ANELVA) so that a film is formed on the organic layer side, followed by mounting of silicon as a target material. The distance between the target and the plastic film with the organic layer formed thereon was set to 50 mm. Nitrogen gas (purity: not less than 99.9995%, manufactured by Taiyo Toyo Sanso Co., Ltd.) and argon gas (purity: not less than 99.9999%, manufactured by Taiyo Toyo Sanso Co., Ltd.) were used as additive gases in the layer formation. The interior of the chamber was evacuated with an oil sealed rotary pump and a cryopump to an ultimate vacuum of $2.5 \times 10^{-4}$ Pa. Subsequently, the nitrogen gas was introduced into the chamber at a flow rate of 15 sccm, and the argon gas was introduced into the chamber at a flow rate of 20 sccm. While maintaining the internal pressure of the chamber at 0.25 Pa by regulating the opening/closing of a valve provided between the vacuum pump and the chamber, an 80 nm-thick silicon oxynitride layer was formed on the organic layer at an input power of 1.2 kW by an RF magnetron sputtering method. The sccm is an abbreviation to standard cubic centimeter per minute.

The gas barrier film thus obtained had a layer construction of polyester film (PET film)/ultraviolet cured organic layer/inorganic layer (silicon oxynitride layer). The water vapor permeability was measured for the gas barrier film by the following method. Specifically, the water vapor permeability was measured with a water vapor permeability measuring apparatus (tradename: AQUATRAN, manufactured by MOCON) under conditions of a measuring temperature of 37.8° C. and a humidity of 100% RH. The results are shown in Table-2 below.

The thickness of the plastic film before the construction of the gas barrier film was evaluated by data on the thickness when the plastic film was commercially obtained. On the other hand, the thickness of the plastic film after the construction of the gas barrier film was measured by machining the gas barrier film with a focused ion beam machining apparatus (FIB: FB-2000, manufactured by Hitachi, Ltd.) to expose the cross-sectional surface of the plastic film and observing the cross-sectional surface under a scanning electron microscope (SEM: S-5000H, manufactured by Hitachi, Ltd.; accelerating voltage 1.5 kV). In this case, any 6 places in the cross-sectional surface of the plastic film were selected for the measurement, and an average of the measured data was adopted as the thickness of the plastic film.

Example 2

A gas barrier film was produced in the same manner as in Example 1, except that, in the inorganic layer formation step, an ion plating film formation method was adopted to form an inorganic layer having the following composition. The inorganic layer formation step that is a point different from Example 1 will be described.

The following evaporation source material for ion plating was provided prior to inorganic layer formation. Specifically, 30 parts by weight of a zinc oxide (ZnO) powder (manufactured by Kojundo Chemical Laboratory Co., Ltd.; average particle diameter: 0.5 µm, as measured by a particle size distribution measuring apparatus/a Coulter counter method; volume resistivity: 10 Ω·cm, as measured by a four-probe method according to JIS (Japanese Industrial Standards) K 7194), an electroconductive material, was added to and mixed with 100 parts by weight of an $Si_3N_4$ powder (manufactured by Kojundo Chemical Laboratory Co., Ltd.; average particle diameter: 1 µm) used as a silicon nitride powder. Subsequently, the raw material powder was rotated while adding dropwise a 2% aqueous cellulose solution as a binder to the raw material powder to obtain 10-mmφ spheres. The spheres were placed in a firing furnace and were held at 400° C. for one hr to obtain an evaporation source material for ion plating that was lumps having an average particle diameter of 7 mmφ. The mass proportion of the evaporation source material thus obtained was measured with an X-ray spectral analyzer (XPS/ESCA). As a result, the mass proportion of zinc oxide was 30 when the mass proportion of silicon dioxide was presumed to be 100. The mass proportion of zinc oxide was substantially in agreement with the mixing ratio of zinc oxide in the raw material powder. ESCA LAB220i-XL manufactured by VG Scientific was used as the X-ray spectral analyzer.

An inorganic layer was formed by an ion plating film formation method. Specifically, in the same manner as in Example 1, a 50 µm-thick polyester film (PET film manufactured by Toray Industries, Inc., tradename: Lumirror X10S, oligomer content: 0.65% by weight) was used as a plastic film, and an organic layer was formed on one surface of the plastic film. The plastic film with an organic layer formed thereon was set in a hollow cathode-type ion plating apparatus so that the film was formed on the organic layer side. Subsequently, the evaporation source material prepared above was introduced into a crucible placed within the hollow cathode-type ion plating apparatus, and the apparatus was then evacuated. After the degree of vacuum reached $5 \times 10^{-4}$ Pa, an argon gas (15 sccm) was introduced into a plasma gun, and a plasma of current 110 A and voltage of 90 V was generated. The plasma was bent in a predetermined direction by maintaining the interior of the chamber at $1 \times 10^{-3}$ Pa and applying magnetic force and was applied to the evaporation source material according to the present invention. It was confirmed that the evaporation source material contained in the crucible sublimed through a melted state. Ion plating was carried out for 5 sec for deposition on the substrate (deposition rate: 360 nm/min) to form a 30 nm-thick SiNZnO layer.

The gas barrier film thus obtained had a layer construction of polyester film (PET film)/ultraviolet cured organic layer/inorganic layer (SiNZnO layer). The water vapor permeability of the gas barrier film was measured in the same manner as in Example 1. The results are shown in Table-2 below.

Example 3

A gas barrier film was produced in the same manner as in Example 1, except that, in the inorganic layer formation step, an inorganic layer having the following composition was formed by a vacuum deposition film formation method. The inorganic layer formation step that is a point different from Example 1 will be described.

In the same manner as in Example 1, a 50 µm-thick polyester film (PET film, manufactured by Toray Industries, Inc., tradename: Lumirror X10S, oligomer content: 0.65% by weight) was used as a plastic film, and an organic layer was formed on one surface of the plastic film. The plastic film with an organic layer formed thereon was set in a vacuum deposition apparatus so that a film was formed on the organic layer side. Subsequently, SiO was evaporated using the vacuum deposition apparatus by a high-frequency heating method under a vacuum of $1.33 \times 10^{-3}$ Pa to form a 40 nm-thick SiOx (x=1.7) layer on the organic layer.

The gas barrier film thus obtained had a layer construction of polyester film (PET film)/ultraviolet cured organic layer/inorganic layer (SiOx (x=1.7)). The water vapor permeability of the gas barrier film was measured in the same manner as in Example 1. The results are shown in Table-2 below.

Example 4

A gas barrier film was produced in the same manner as in Example 1, except that a 125 µm-thick polyester film (PET film, manufactured by Toray Industries, Inc., tradename: Lumirror X10S, oligomer content: 0.53% by weight) was used as the plastic film. For the oligomer content, as in Example 1, data described in the homepage of Toray Industries, Inc. were used. The surface roughness of the plastic film was measured in the same manner as in Example 1 and was found to be 1.5 µm in terms of the maximum level difference. For the gas barrier film thus obtained, the water vapor permeability was measured in the same manner as in Example 1. The results are shown in Table-2 below.

Example 5

A gas barrier film was produced in the same manner as in Example 1, except that a 300 µm-thick polyester film (PET film, manufactured by Toray Industries, Inc., tradename: Lumirror X10S, oligomer content: 0.37% by weight) was used as the plastic film. For the oligomer content, as in Example 1, data described in the homepage of Toray Co., Ltd. were used. The surface roughness of the plastic film was measured in the same manner as in Example 1 and was found to be 1.6 µm in terms of the maximum level difference. For the gas barrier film thus obtained, the water vapor permeability was measured in the same manner as in Example 1. The results are shown in Table-2 below.

Example 6

A gas barrier film was produced in the same manner as in Example 1, except that the thickness of the organic layer was changed to 3 μm. For the gas barrier film thus obtained, the water vapor permeability was measured in the same manner as in Example 1. The results are shown in Table-2 below.

Example 7

A gas barrier film was produced in the same manner as in Example 1, except that the thickness of the organic layer was changed to 2.0 μm. For the gas barrier film thus obtained, the water vapor permeability was measured in the same manner as in Example 1. The results are shown in Table-2 below.

Example 8

A gas barrier film was produced in the same manner as in Example 1, except that the thickness of the organic layer was changed to 17 μm. For the gas barrier film thus obtained, the water vapor permeability was measured in the same manner as in Example 1. The results are shown in Table-2 below.

Comparative Example 1

A gas barrier film was produced in the same manner as in Example 1, except that the organic layer was not formed. For the gas barrier film thus obtained, the water vapor permeability was measured in the same manner as in Example 1. The results are shown in Table-2 below.

Comparative Example 2

A gas barrier film was produced in the same manner as in Example 1, except that the thickness of the organic layer was changed to 1 μm. For the gas barrier film thus obtained, the water vapor permeability was measured in the same manner as in Example 1. The results are shown in Table-2 below.

Comparative Example 3

A gas barrier film was produced in the same manner as in Example 1, except that a 50 μm-thick polyester film (PET film, manufactured by Toray Industries, Inc., tradename: Lumirror S10, oligomer content: about 1.6% by weight) was used as the plastic film, the oligomer content of which had not been lowered. For the oligomer content, as in Example 1, data described in the homepage of Toray Industries, Inc. were used. Further, the oligomer content was determined by the following method. For Lumirror S10, in the homepage, there is a description to the effect that, when the thickness is 250 μm, the oligomer content (oligomer amount) is 1.4% by weight. For Lumirror X10S, when the thickness is changed from 250 μm to 50 μm, the oligomer content is changed from 0.46% by weight to 0.65% by weight, that is, the oligomer content is increased by about 0.2% by weight. Accordingly, it was regarded that, also for Lumirror S10, when the thickness is 50 μm, the oligomer content is higher than that in the thickness of 250 μm by about 0.2% by weight, that is, the oligomer content is 1.4+0.2=1.6% by weight. Further, the surface roughness of the plastic film, of which the oligomer content had not been reduced, was measured in the same manner as in Example 1 and was found to be 0.6 μm in terms of maximum level difference. For the gas barrier film thus obtained, the water vapor permeability was measured in the same manner as in Example 1. The results are shown in Table-2 below.

TABLE 2

| | Plastic film | | Maximum level difference of plastic film surface (μm) | Thickness of organic layer (μm) | Method for inorganic layer formation | Thickness of inorganic layer (nm) | Maximum level difference after inorganic layer formation (nm) | Water vapor permeability (g/m²/day) |
|---|---|---|---|---|---|---|---|---|
| | Type | Oligomer content (% by weight) | | | | | | |
| Example 1 | x10S (50 μm) | 0.65 | 1.3 | 5.0 | Sputtering | 80 | 33 | 0.004 |
| Example 2 | x10S (50 μm) | 0.65 | 1.3 | 5.0 | Ion plating | 30 | 26 | 0.002 |
| Example 3 | x10S (50 μm) | 0.65 | 1.3 | 5.0 | Vacuum deposition | 40 | 34 | 0.005 |
| Example 4 | x10S (125 μm) | 0.53 | 1.5 | 5.0 | Sputtering | 80 | 48 | 0.004 |
| Example 5 | x10S (300 μm) | 0.37 | 1.6 | 5.0 | Sputtering | 80 | 42 | 0.002 |
| Example 6 | x10S (50 μm) | 0.65 | 1.3 | 3.0 | Sputtering | 80 | 40 | 0.008 |
| Example 7 | x10S (50 μm) | 0.65 | 1.3 | 2.0 | Sputtering | 80 | 47 | 0.005 |
| Example 8 | x10S (50 μm) | 0.65 | 1.3 | 1.7 | Sputtering | 80 | 52 | 0.006 |
| Comparative Example 1 | x10S (50 μm) | 0.65 | 1.3 | Not provided | Sputtering | 80 | 1379 | 0.7 |
| Comparative Example 2 | x10S (50 μm) | 0.65 | 1.3 | 1.0 | Sputtering | 80 | 136 | 0.3 |
| Comparative Example 3 | S10 (50 μm) | 1.6 | 0.6 | 5.0 | Sputtering | 80 | 32 | 0.06 |

Figure 2:
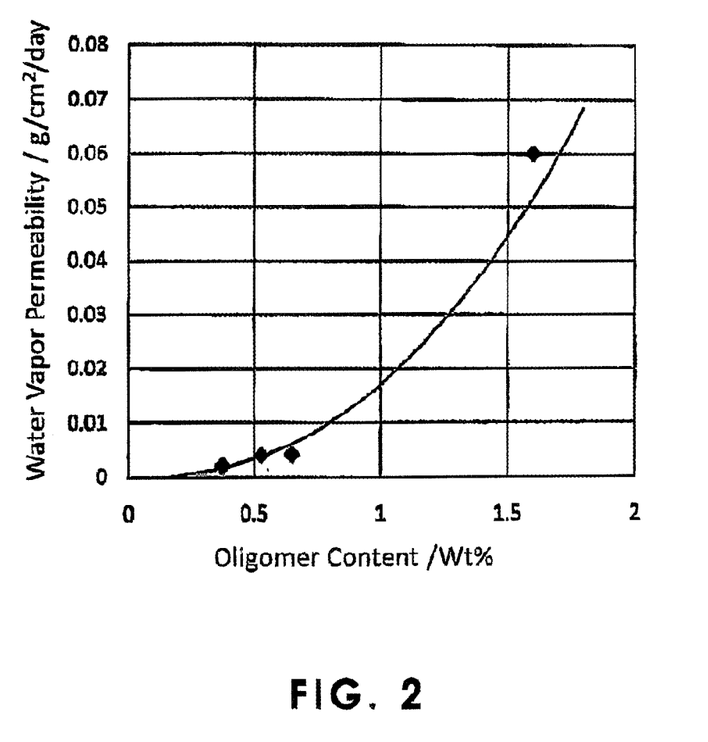
FIG. 2 is a graph showing a relationship between an oligomer content of a plastic film and a water vapor permeability.

FIG. 2 is a graph showing a relationship between the oligomer content of plastic films and the water vapor permeability of gas barrier films. Specifically, FIG. 2 is a graph obtained by plotting the relationship between the oligomer content of plastic films and the water vapor permeability for gas barrier films that comprise a 5 μm-thick organic layer formed by sputtering (Examples 1 and 4 to 8 and Comparative Example 3) among data shown in Table-2. From FIG. 2, it is apparent that the water vapor permeability can be brought to a level of not more than $10^{-2}$ g/m²/day (not more than 0.01 g/m²/day) by bringing the oligomer content of the plastic film to not more than 1.0% by weight, whereby gas barrier properties on a very high level can be realized.

DESCRIPTION OF REFERENCE CHARACTERS

1: gas barrier film
2: plastic film
3: organic layer
4: inorganic layer

The invention claimed is:

1. A gas barrier film comprising:
   a plastic film containing an oligomer in an amount of 0.01% by weight to 0.8% by weight;
   an organic layer provided on the plastic film; and
   an inorganic layer provided on the organic layer;
   wherein the organic layer has a thickness that is larger than a maximum difference in elevation on a surface of the plastic film;
   wherein the maximum difference in elevation of profile peaks and valleys in the surface of the plastic film is not less than 0.7 µm and not more than 5 µm; and
   wherein the plastic film is a hydrolysis-resistant polyester resin film made of polyethylene terephthalate, wherein the hydrolysis resistance is improved by reducing the oligomer content of the plastic film.

2. A gas barrier film comprising:
   a plastic film containing an oligomer in an amount of 0.01% by weight to 0.8% by weight;
   an organic layer provided on the plastic film; and
   an inorganic layer provided on the organic layer;
   wherein the organic layer has a thickness of not less than 1.7 µm to not more than 10 µm;
   wherein a maximum difference in elevation of profile peaks and valleys in a surface of the plastic film is not less than 0.7 µm and not more than 5 µm; and
   wherein the plastic film is a hydrolysis-resistant polyester resin film made of polyethylene terephthalate, wherein the hydrolysis resistance is improved by reducing the oligomer content of the plastic film.

3. A display device that comprises a gas barrier film according to claim 1.

4. A process for producing a gas barrier film, comprising:
   a plastic film provision step of providing a plastic film containing an oligomer in an amount of 0.01% by weight to 0.8% by weight, said plastic film being a hydrolysis-resistant polyester resin film;
   an organic layer formation step of forming an organic layer on the plastic film, the organic layer having a thickness that is larger than a maximum difference in elevation on the surface of the plastic film; and
   an inorganic layer formation step of forming an inorganic layer on the organic layer.

5. A display device that comprises a gas barrier film according to claim 2.

6. A power generating device that comprises a gas barrier film according to claim 1.

7. A power generating device that comprises a gas barrier film according to claim 2.

* * * * *